United States Patent [19]

Hathorn et al.

[11] Patent Number: 5,574,950

[45] Date of Patent: Nov. 12, 1996

[54] REMOTE DATA SHADOWING USING A MULTIMODE INTERFACE TO DYNAMICALLY RECONFIGURE CONTROL LINK-LEVEL AND COMMUNICATION LINK-LEVEL

[75] Inventors: Roger G. Hathorn; Bret W. Holley; James L. Iskiyan; William F. Micka; Asim R. Qureshi, all of Tucson, Ariz.

[73] Assignee: International Business Machines Corporation, Armonk, N.Y.

[21] Appl. No.: 203,248

[22] Filed: Mar. 1, 1994

[51] Int. Cl.$^6$ .................................................. G06F 15/02
[52] U.S. Cl. ............... 395/861; 395/200.09; 364/222.2; 364/242.94; 364/242.5; 364/DIG. 1
[58] Field of Search ..................... 364/952, 200; 395/650, 145, 600, 575, 200.01, 200.02, 200.09, 821, 861

[56] References Cited

U.S. PATENT DOCUMENTS

| | | | |
|---|---|---|---|
| 5,058,056 | 10/1991 | Hammer et al. | 364/900 |
| 5,089,958 | 2/1992 | Horton et al. | 395/575 |
| 5,155,845 | 10/1992 | Beal et al. | 395/575 |
| 5,404,508 | 4/1995 | Konrad et al. | 395/600 |
| 5,420,988 | 5/1995 | Elliott | 395/275 |
| 5,446,871 | 8/1995 | Shomler et al. | 395/180 |

FOREIGN PATENT DOCUMENTS

| | | | |
|---|---|---|---|
| 0212425 | 3/1987 | European Pat. Off. | G06F 13/10 |
| 0359384 | 3/1990 | European Pat. Off. | G06F 11/10 |

OTHER PUBLICATIONS

"Escon I/U Interface" SA22-7202-01 Enterprise Systems Architecture/390.

*Primary Examiner*—Thomas C. Lee
*Assistant Examiner*—Terance J. Stanton
*Attorney, Agent, or Firm*—Floyd E. Anderson; Robert M. Sullivan

[57] ABSTRACT

A remote copy system incorporates dynamically modifiable ports on the storage controllers such that those ports can operate either as a control unit link-level facility or as a channel link-level facility. When configured as a channel link-level facility, a primary storage controller can appear as a host processor to a secondary storage controller. Using dynamic switches coupled between primary and secondary sites, fewer ESCON communication links are required since the ESCON communication links can function either as a channel or as storage controller communication link.

17 Claims, 9 Drawing Sheets

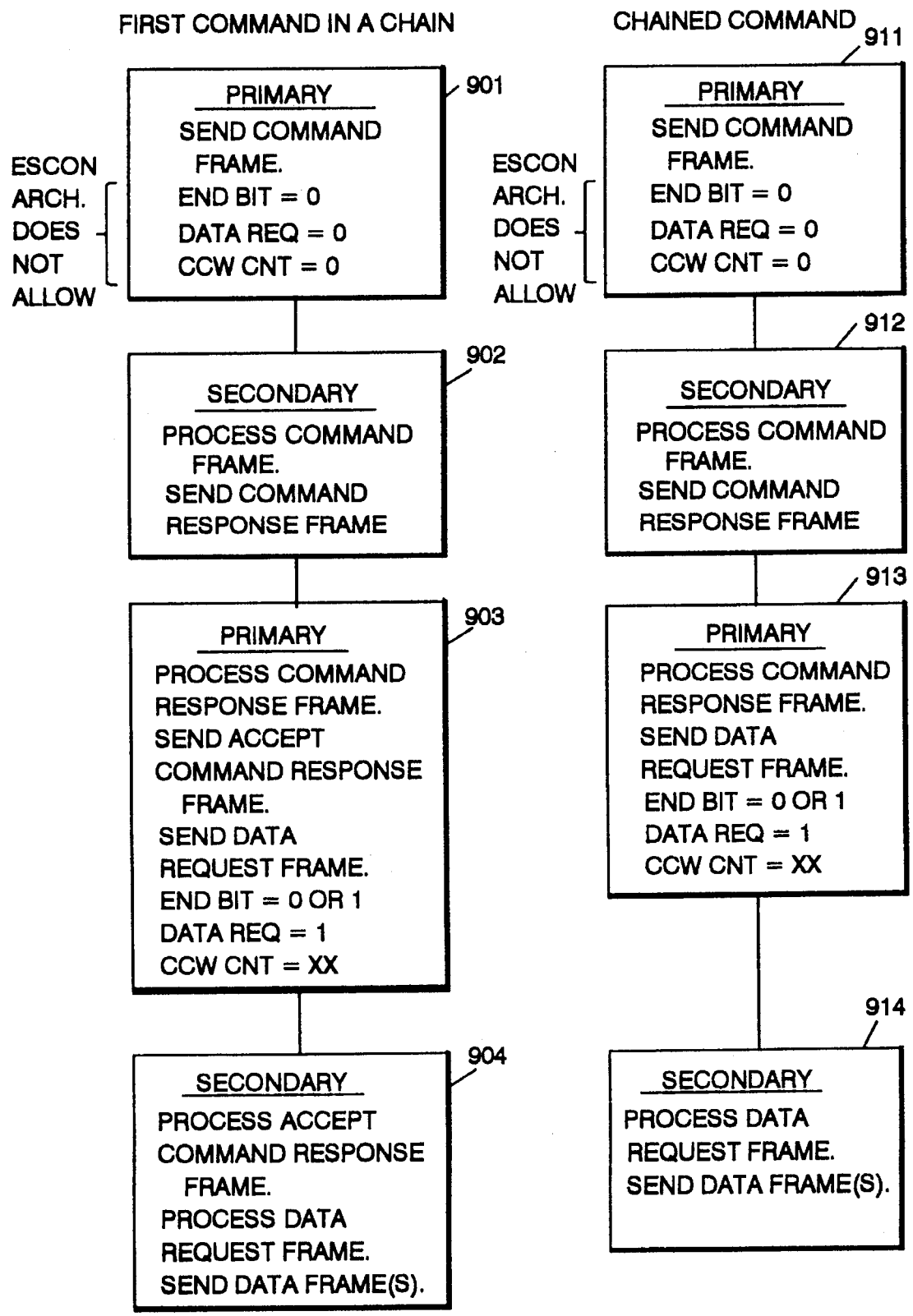

REMOTE DATA SHADOWING USING A MULTIMODE INTERFACE TO DYNAMICALLY RECONFIGURE CONTROL LINK-LEVEL AND COMMUNICATION LINK-LEVEL

FIELD OF THE INVENTION

The present invention relates generally to remote data shadowing, and more particularly, to a system for remote data shadowing wherein communication links are operable in multiple modes.

BACKGROUND OF THE INVENTION

Data processing systems, in conjunction with processing data, typically are required to store large amounts of data (or records), which data can be efficiently accessed, modified, and re-stored. Data storage is typically separated into several different levels, or hierarchically, in order to provide efficient and cost effective data storage. A first, or highest level of data storage involves electronic memory, usually dynamic or static random access memory (DRAM or SRAM). Electronic memories take the form of semiconductor integrated circuits wherein millions of bytes of data can be stored on each circuit, with access to such bytes of data measured in nano-seconds. The electronic memory provides the fastest access to data since access is entirely electronic.

A second level of data storage usually involves direct access storage devices (DASD). DASD storage, for example, can comprise magnetic and/or optical disks, which store bits of data as micrometer sized magnetically or optically altered spots on a disk surface for representing the "ones" and "zeros" that make up those bits of the data. Magnetic DASD, includes one or more disks that are coated with remnant magnetic material. The disks are rotatably mounted within a protected environment. Each disk is divided into many concentric tracks, or closely spaced circles. The data is stored serially, bit by bit, along each track. An access mechanism, known as a head disk assembly (HDA), typically includes one or more read/write heads, and is provided in each DASD for moving across the tracks to transfer the data to and from the surface of the disks as the disks are rotated past the read/write heads. DASDs can store giga bytes of data with the access to such data typically measured in milli-seconds (orders of magnitudes slower than electronic memory). Access to data stored on DASD is slower due to the need to physically position the disk and HDA to the desired data storage locations.

A third or lower level of data storage includes tape and/or tape and DASD libraries. At this storage level, access to data is much slower in a library since a robot or operator is necessary to select and load the needed data storage medium. The advantage is reduced cost for very large data storage capabilities, for example, tera-bytes of data storage. Tape storage is often used for back-up purposes, that is, data stored at the second level of the hierarchy is reproduced for safe keeping on magnetic tape. Access to data stored on tape and/or in a library is presently on the order of seconds.

Having a back-up data copy is mandatory for many businesses as data loss could be catastrophic to the business. The time required to recover data lost at the primary storage level is also an important recovery consideration. An improvement in speed over tape or library back-up, includes dual copy. An example of dual copy involves providing additional DASD's so that data is written to the additional DASDs (sometimes referred to as mirroring). Then if the primary DASDs fail, the secondary DASDs can be depended upon for data. A drawback to this approach is that the number of required DASDs is doubled.

Another data back-up alternative that overcomes the need to double the storage devices involves writing data to a redundant array of inexpensive devices (RAID) configuration. In this instance, the data is written such that the data is apportioned amongst many DASDs. If a single DASD fails, then the lost data can be recovered by using the remaining data and error correction procedures. Currently there are several different RAID configurations available.

The aforementioned back-up solutions are generally sufficient to recover data in the event that a storage device or medium fails. These back-up methods are useful only for device failures since the secondary data is a mirror of the primary data, that is, the secondary data has the same volume serial numbers (VOLSERs) and DASD addresses as the primary data. System failure recovery, on the other hand, is not available using mirrored secondary data. Hence still further protection is required for recovering data if a disaster occurs destroying the entire system or even the site, for example, earthquakes, fires, explosions, hurricanes, etc. Disaster recovery requires that the secondary copy of data be stored at a location remote from the primary data. A known method of providing disaster protection is to back-up data to tape, on a daily or weekly basis, etc. The tape is then picked up by a vehicle and taken to a secure storage area usually some kilometers away from the primary data location. A problem is presented in this back-up plan in that it could take days to retrieve the back-up data, and meanwhile several hours or even days of data could be lost, or worse, the storage location could be destroyed by the same disaster. A somewhat improved back-up method includes transmitting data to a back-up location each night. This allows the data to be stored at a more remote location. Again, some data may be lost between back-ups since back-up does not occur continuously, as in the dual copy solution. Hence, a substantial data amount could be lost which may be unacceptable to some users.

A back-up solution providing a greater degree of protection is remote dual copy which requires that primary data stored on primary DASDs be shadowed at a secondary or remote location. The distance separating the primary and secondary locations depends upon the level of risk acceptable to the user, and for synchronous data communications, can vary from just across a fire-wall to several kilometers. The secondary or remote location, in addition to providing a back-up data copy, must also have enough system information to take over processing for the primary system should the primary system become disabled. This is due in part because a single storage controller does not write data to both primary and secondary DASD strings at the primary and secondary sites. Instead, the primary data is stored on a primary DASD string attached to a primary storage controller while the secondary data is stored on a secondary DASD string attached to a secondary storage controller.

Remote dual copy falls into two general categories, synchronous and asynchronous. Synchronous remote copy allows sending primary data to the secondary location and confirming the reception of such data before ending a primary DASD input/output (I/O) operation (providing a channel end (CE)/device end (DE) to the primary host). Synchronous remote copy, therefore, slows the primary DASD I/O response time while waiting for secondary confirmation. Primary I/O response delay is increased proportionately with the distance between the primary and secondary systems—a factor that limits the remote distance to tens of kilometers. Synchronous remote copy, however, provides sequentially consistent data at the secondary site with relatively little system overhead.

Asynchronous remote copy provides better primary application system performance because the primary DASD I/O operation is completed (providing a channel end (CE)/ device end (DE) to the primary host) before data is confirmed at the secondary site. Therefore, the primary DASD I/O response time is not dependent upon the distance to the secondary site and the secondary site could be thousands of kilometers remote from the primary site. A greater amount of system overhead is required, however, for ensuring data sequence consistency since data received at the secondary site will often arrive in an order different from that written on the primary DASDs. A failure at the primary site could result in some data being lost that was in transit between the primary and secondary location.

Synchronous real time remote copy for disaster recovery requires that copied DASD volumes form a set. Forming such a set further requires that a sufficient amount of system information be provided to the secondary site for identifying those volumes (VOLSERs) comprising each set and the primary site equivalents. Importantly, a volume at the secondary site forms a "duplex pair" with a volume at the primary site and the secondary site must recognize when one or more volumes are out of sync with the set, that is, "failed duplex" has occurred. Connect failures are more visible in synchronous remote copy than in asynchronous remote copy because the primary DASD I/O is delayed while alternate paths are retried. The primary site can abort or suspend copy to allow the primary site to continue while updates for the secondary site are queued. The primary site marks such updates to show the secondary site is now out of sync.

Maintaining a connection between the secondary site and the primary site with secondary DASD present and accessible, however, does not ensure content synchronism. The secondary site may lose synchronism with the primary site for a number of reasons. The secondary site is initially out of sync when the duplex pair is being formed and reaches sync when an initial data copy is completed. The primary site may break the duplex pair if the primary site is unable to write updated data to the secondary site in which case the primary site writes updates to the primary DASD under suspended duplex pair conditions so that the updating application can continue. The primary site is thus running exposed, that is, without current disaster protection copy until the duplex pair is restored. Upon restoring the duplex pair, the secondary site is not immediately in sync. After applying now pending updates, the secondary site returns to sync. The primary site can also cause the secondary site to lose sync by issuing a suspend command for that volume to the primary DASD. The secondary site re-syncs with the primary site after the suspend command is ended, duplex pair is re-established, and pending updates are copied. On-line maintenance can also cause synchronization to be lost.

When a secondary volume is out of sync with a primary volume, the secondary volume is not useable for secondary system recovery and resumption of primary applications. An out-of-sync volume at the secondary site must be identified as such and secondary site recovery-takeover procedures need to identify the out-of-sync volumes for denying application access (forcing the volumes off-line or changing their VOLSERs). The secondary site may be called upon to recover the primary site at any instant wherein the primary site host is inaccessible - thus the secondary site requires all pertinent information about a sync state of all volumes.

More recently introduced data disaster recovery solutions include remote dual copy wherein data is backed-up not only remotely, but also continuously. In order to communicate duplexed data synchronously from one host processor to another host processor, or from one storage controller to another storage controller, or some combination thereof, expensive communication links are required for connecting each host processor and/or storage controller. Such communication links, include, for example, Enterprise Systems Connection (ESCON) fiber optic links providing serial communication paths extending tens of kilometers.

In a typical remote dual copy system, there may exist multiple primary processors connected, by multiple serial or parallel communication links, to multiple primary storage controllers, each having strings of primary DASDs attached thereto. A similar processing system may exist at a remote secondary site. Additionally, many communication links may be required to connect primary processors to secondary processors and/or secondary storage controllers, and primary storage controllers may be connected to secondary storage controllers and/or secondary processors. Each communication link presents a substantial expense in the remote dual copy system. This expense is exacerbated by the fact that communication between a primary processor and a secondary storage subsystem, and between a primary storage subsystem and a secondary storage subsystem presently requires two separately dedicated communication links though these links may be inactive for substantial periods of time.

Accordingly it is desired to provide a method and apparatus for providing a real time update of data consistent with the data at a primary processing location using shared communication links that can dynamically interface either a host processor to a storage controller, or can interface one storage controller to another storage controller, thus reducing a number of communication links required.

SUMMARY OF THE INVENTION

An object of the present invention is to provide an improved design and method for communicating between host processors and storage controllers or between storage controllers.

Another object of the present invention is to provide dynamically alterable link-level facilities.

According to a first embodiment of the present invention, a method of communicating between a host processor, a first storage subsystem, and a second storage subsystem, the host processor, and first and second storage subsystems coupled together by at least one communication link and at least one dynamic switch. The host processor and each first and second storage subsystem having at least one link-level facility. The method includes machine effected steps of: initializing paths, wherein the host processor link-level facility is configured as a channel, and the first and second storage subsystem link-level facilities are each configured as a control unit link-level facility. Paths between the host processor, and first and second storage controllers are then configured. The first storage subsystem establishes logical paths between the first and second storage subsystems, wherein the first storage subsystem link-level facility is dynamically re-configured as a channel link-level facility, the first storage subsystem acting as a host to the second storage subsystem. Establishing pathing control is accomplished wherein the first storage subsystem transmits an establish pathing control (EPC) frame to the second storage controller for processing.

In another embodiment of the present invention, a storage controller for communicating with a host processor and another storage controller over an enterprise system connection (ESCON) link is described. The host processor has a channel link-level facility. The storage controller comprises a serial adapter for connecting to the ESCON link, and a storage path for coupling the storage controller with a storage device. A link level facility at the storage controller is dynamically reconfigurable as a control unit link-level facility for communicating with the host processor over the ESCON link, and further dynamically re-configurable as a channel link-level facility for communicating with the another storage controller over the ESCON link, wherein the storage controller acts as host to the another storage controller.

The foregoing and other objects, features, and advantages of the invention will be apparent from the following more particular description of a preferred embodiment of the invention, as illustrated in the accompanying drawing.

Description of the Figures

FIG. 9 is a flow diagram showing modified Read Command protocols according to a preferred embodiment of the present invention.

Detailed Description

Figure 1:
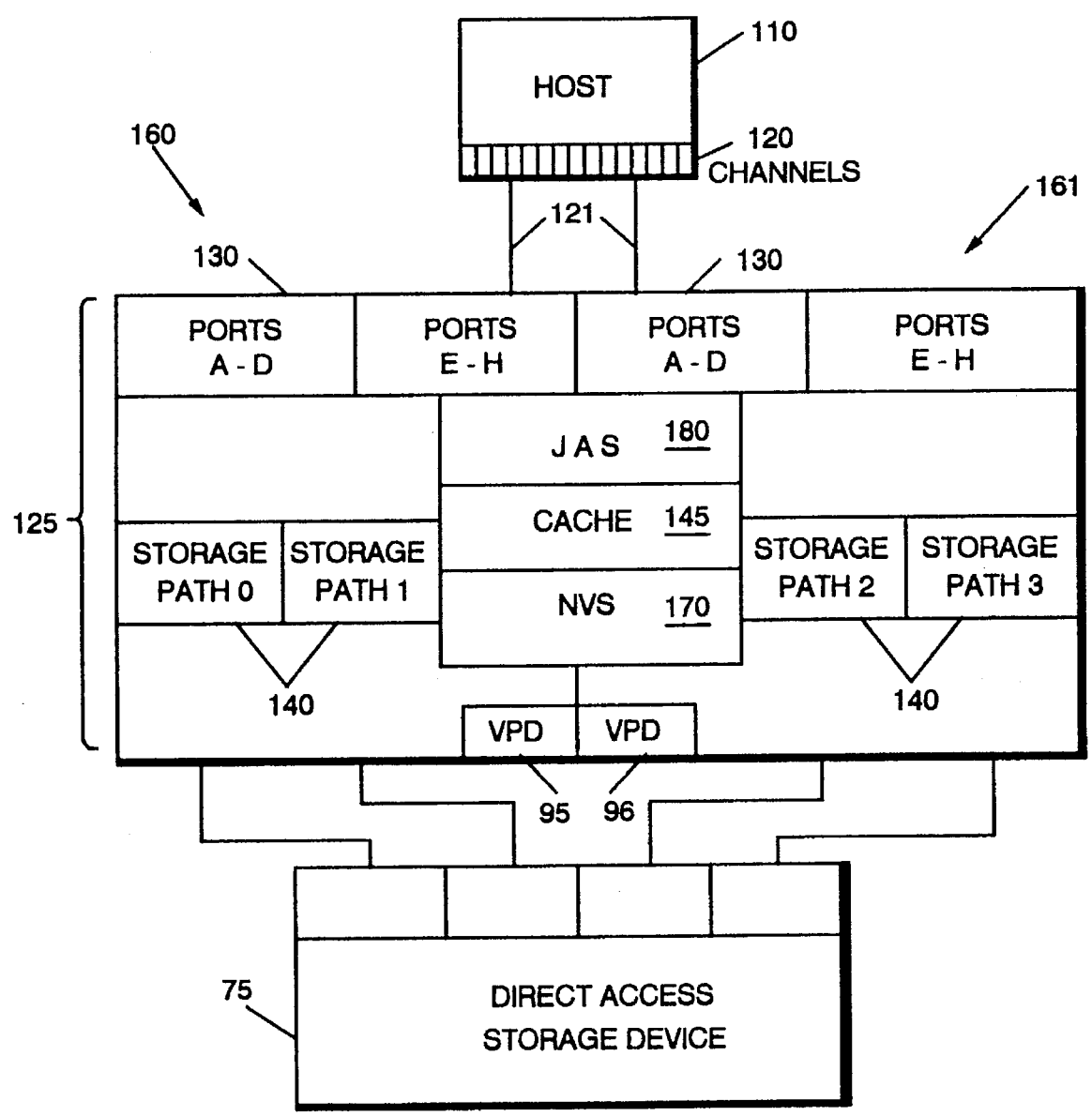
FIG. 1 is a block diagram of a prior art data processing system including a host processor and storage subsystem.

Referring to FIG. 1, a typical data processing system is shown including a host processor 110, such as an IBM System/370 or IBM Enterprise Systems/9000 (ES/9000) processor for computing and manipulating data, and running, for example, data facility storage management subsystem/multiple virtual systems (DFSMS/MVS) software, having at least one storage controller 125 attached thereto, for example an IBM 3990 storage controller. The storage controller 125 is further connected to a direct access storage device (DASD) 75, such as an IBM 3380 or 3390 DASD. A storage subsystem is formed by the storage controller 125 and DASD 75. Substantial computing power is provided by the host processor 110 while the storage controller 125 provides the necessary functions to efficiently transfer, stage/destage, convert and generally access large databases. The storage subsystem is connected to the host processor 110 via communication links 121, wherein the communication links 121 connect to channels 120 of the host processor 110 and to ports A–D, E–H 130 of the storage controller 125. The communication links 121 can be either parallel or serial links, for example, enterprise system connections (ESCON) serial fiber optic links. The ESCON links 121 are described in greater detail in ESCON I/O Interface, IBM publication number SA22-7202, which is hereby incorporated by reference.

The storage controller 125 includes dual clusters 160 and 161, the dual clusters 160, 161 having separate power supplies (not shown) and further including ports A–D, E–F 130 for providing a communication interface thereto. Both non-volatile storage 170 and cache 145 are provided for temporary data storage and is accessible to both clusters 160, 161. Storage paths 0–3 140 provide necessary paths to the DASD 75. Vital product data is maintained in VPDs 95 and 96. A storage controller, similar to the storage controller 125 is described in U.S. Pat. No. 5,051,887, assigned to the assignee of the present invention, and is hereby incorporated by reference.

Figure 2:
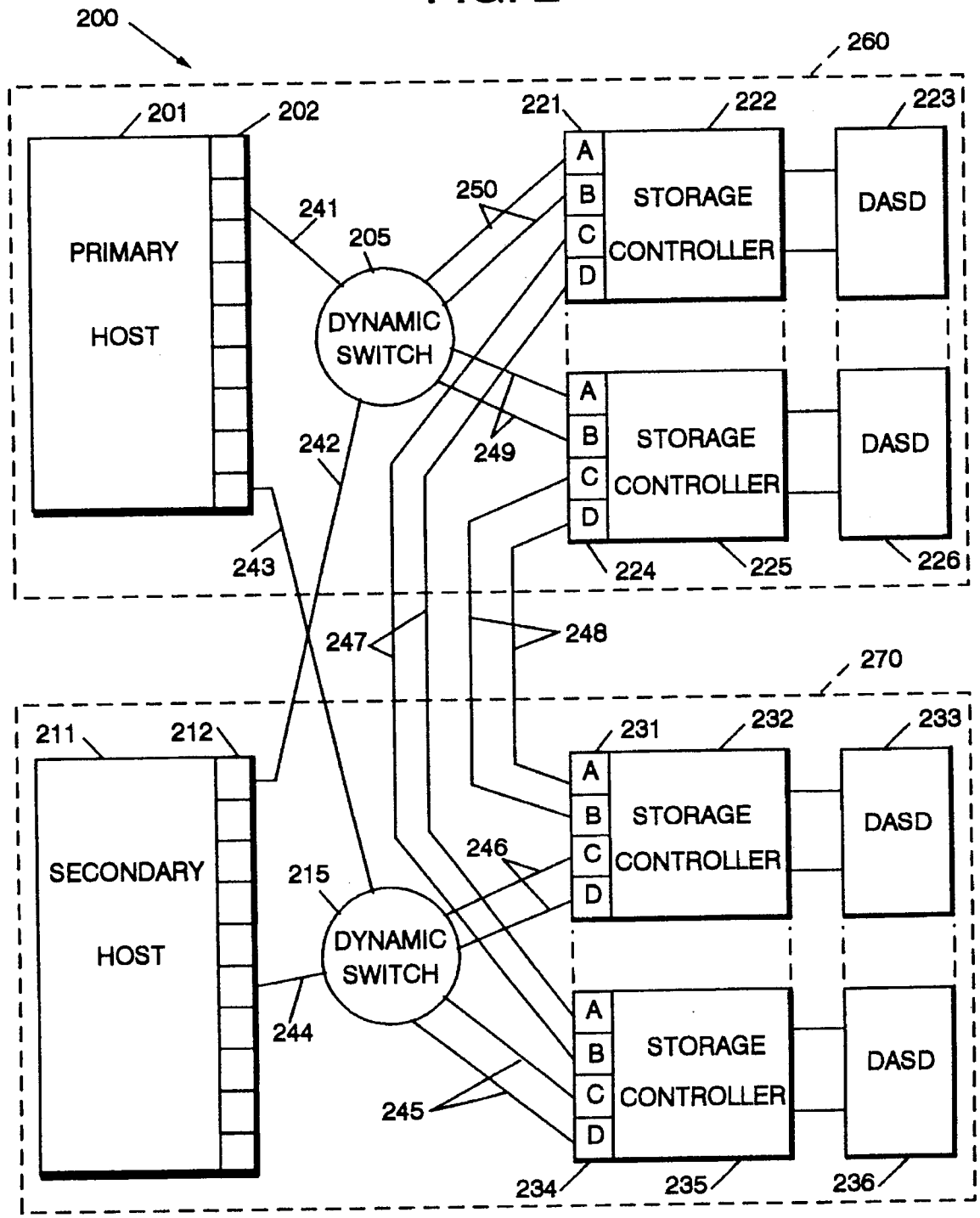
FIG. 2 is a block diagram depicting a remote dual copy system including primary and secondary sites.

Referring now to FIG. 2, a remote dual copy system 200 is shown having a primary site 260 and a secondary site 270, wherein the secondary site 270 is located, for example, 20 kilometers remote from the primary site 260. The primary site 260 includes a host or primary processor 201 (hereinafter referred to as primary host 201), for example, an IBM Enterprise Systems/9000 (ES/9000) processor running DFSMS/MVS operating software, and further having several application programs running thereon. A plurality of primary storage controllers 222, 225, for example, IBM 3990 Model 6 storage controllers, are coupled to the primary host 201 via a dynamic switch 205, for example, an IBM ESCON Director. As is known in the art, several primary hosts 201 can be coupled to the plurality of primary storage controllers 222, 225. Primary DASD 223, 226, for example, IBM 3390 DASDs, are connected to the plurality of primary storage controllers 222, 225. Several primary DASDs 223, 226 can be connected to the plurality of primary storage controllers 222, 225. The plurality of primary storage controllers 222, 225 and attached primary DASDs 223, 226 form a primary storage subsystem. Alternatively, each primary storage controller 222, 225, and corresponding primary DASD 223, 226 could be integrated as single units.

The primary host 201 connects to ports (not shown) of the dynamic switch 205 from primary host channels 202 via a communication link 241, for example, a serial communication link. Similarly, ports of the dynamic switch 205 connect to ports (also known as link-level facilities) 221, 224 of the primary storage controllers 222, 225, respectively, via communication links 249, 250, for example, ESCON links. The primary host 201, then, can communicate with each of the primary storage controllers 222, 225 using the communication links 241, 249, and 250, and the dynamic switch 205.

The secondary site 270 includes a host or secondary processor 211 (hereinafter referred to as secondary host 211), for example, an IBM ES/9000, running DFSMS/MVS operating software. A plurality of secondary storage controllers 232, 235, for example, IBM 3990 Model 6 storage controllers, are coupled to the secondary host 211 via a dynamic switch 215, for example, an IBM ESCON Director. As is known in the art, several secondary hosts 211 can be coupled to the plurality of secondary storage controllers 232, 235. Secondary DASDs 233, 236, for example, IBM 3390 DASDs, are connected to the plurality of secondary storage controllers 232, 235. Several secondary DASDs 233, 236 can be connected to the plurality of secondary storage controllers 232, 235. The plurality of secondary storage controllers 232, 235 and attached secondary DASDs 233, 236 form a secondary storage subsystem.

The secondary host 211 connects to ports (not shown) of the dynamic switch 205 from secondary host channels 212 via a communication link 244, for example, a serial communication link. Similarly, ports of the dynamic switch 215 connect to ports 231, 234 of the secondary storage controllers 232, 235, respectively, via communication links 245, 246, for example, ESCON links. The secondary host 211, then, can communicate with each of the secondary storage controllers 232, 235 using the communication links 244, 245, and 246, and the dynamic switch 215.

Communications occur between the primary site 260 and the secondary site 270 via two mechanisms. First, the primary host is connected to the secondary site 270 via a channel link 243 connected between the primary host channel 202 and the dynamic switch 215. Similarly, the secondary host is connected to the primary site 260 via a channel link 242 connected between the secondary host channel 212 and the dynamic switch 205. Second, communication links 247 connect primary storage controller 222 to secondary storage controller 235 via respective ports 221 and 234. Similarly, communication links 248 connect primary storage controller 225 to secondary storage controller 232 via respective ports 224 and 231.

The primary host 201 can thus communicate with any secondary storage controller 232, 235, or the secondary host 211 via the dynamic switch 205 or 215. Likewise, the secondary host can communicate with any primary storage controller 222, 225, or the primary host 201 via the dynamic switch 205 or 215. Additionally, primary storage controllers 222, 225 can communicate with secondary storage controllers 232, 235, respectively. Thus, the primary host 201 could send data or records for back-up directly to the secondary storage subsystem (however, this may be undesirable due to the required primary host resources). More desirably, primary storage controllers 222, 225 send data or records for back-up directly to secondary storage controllers 232, 235, respectively. This communication is quicker since the primary host need only wait until the data or records are received in secondary storage controllers 232, 235 cache (see FIG. 1).

An area for improvement to the remote dual copy system 200 revolves around the number of required communication links 241–250 and the associated expense. Furthermore, primary storage controller ports (A, B) 221, 224, and secondary storage controller ports (C, D) 231, 234 are dedicated control unit link-level facilities and cannot communicate as channel link-level facilities. Similarly, primary storage controller ports (C, D) 221, 224 are dedicated channel link-level facilities (and cannot communicate with primary host channels 202), and secondary storage controller ports (A, B) 231, 234 are dedicated control unit link-level facilities.

Figure 3:
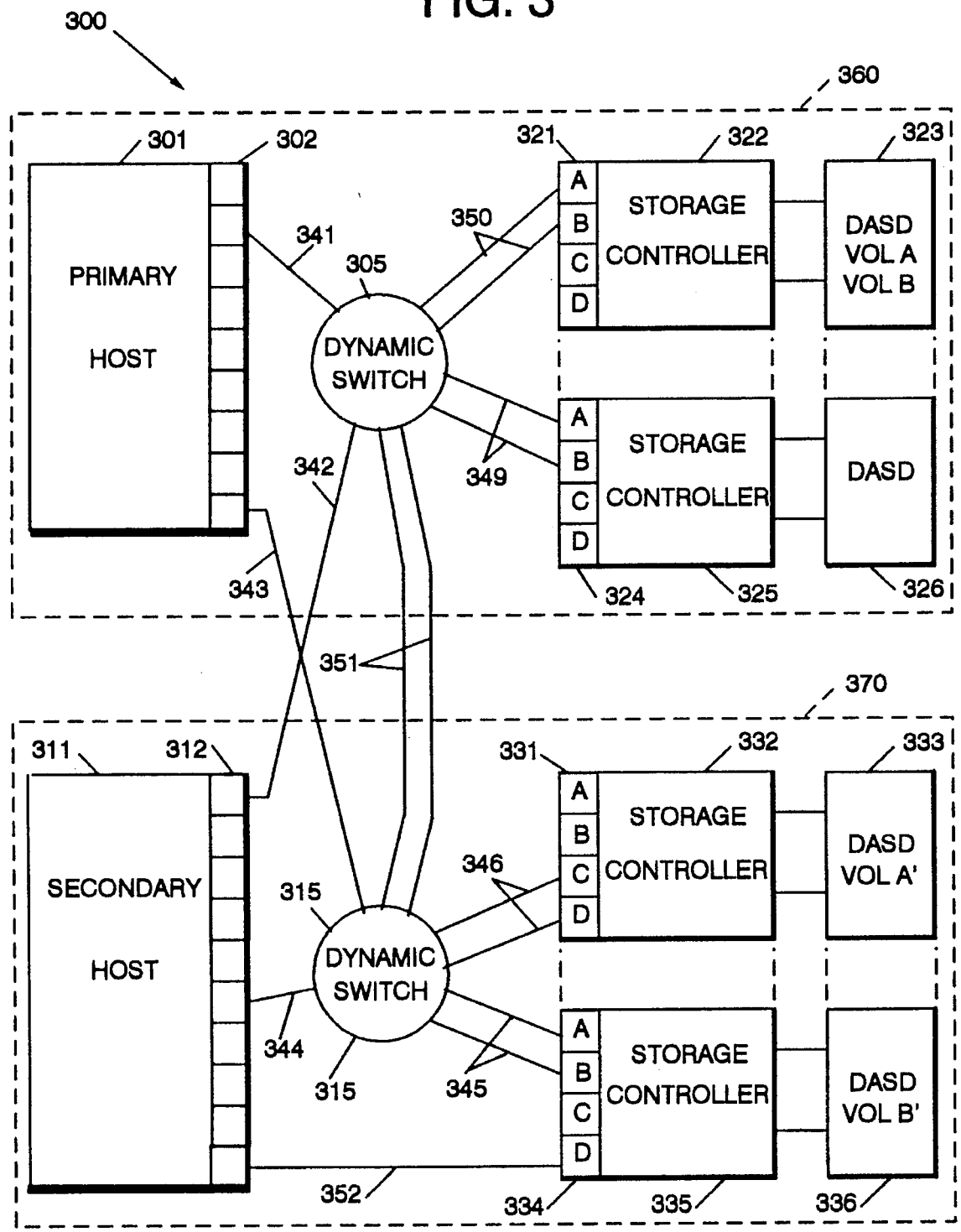
FIG. 3 is a block diagram of a remote dual copy system according to a preferred embodiment of the present invention.

FIG. 3 depicts a remote dual copy system 300 that is similar to but improves upon the remote dual copy system 200. The communication links 247 and 248 are reduced to and replaced by communication links 351. The communication links 351 are connected between dynamic switches 305 and 315. Not only are the number of communication links reduced, but additional ports on the primary and secondary storage controllers are opened for other communications, for example, a communication link 352 (serial or parallel) connecting a secondary host channel 312 to secondary storage controller 335 is now available. Reducing a number of communication links is enabled by modification of the storage controller ports or link-level facilities into dual function link-level facilities. For example, the primary and secondary storage controller ports 321, 324, 331, and 334 can be dynamically set to communicate either as a channel or control unit link-level facility. Hence, primary storage controller 322, via port A 321, can communicate with primary host 301 by communication links 350, dynamic switch 305 and communication link 341, wherein port A 321 is a control unit link-level facility. Alternately, primary storage controller 322, via the same port A 321, can communicate with secondary storage controller 332 by communication links 350, dynamic switch 305, communication links 351, dynamic switch 315, and communication links 346, wherein port A 321 acts as a channel link-level facility.

Figure 4:
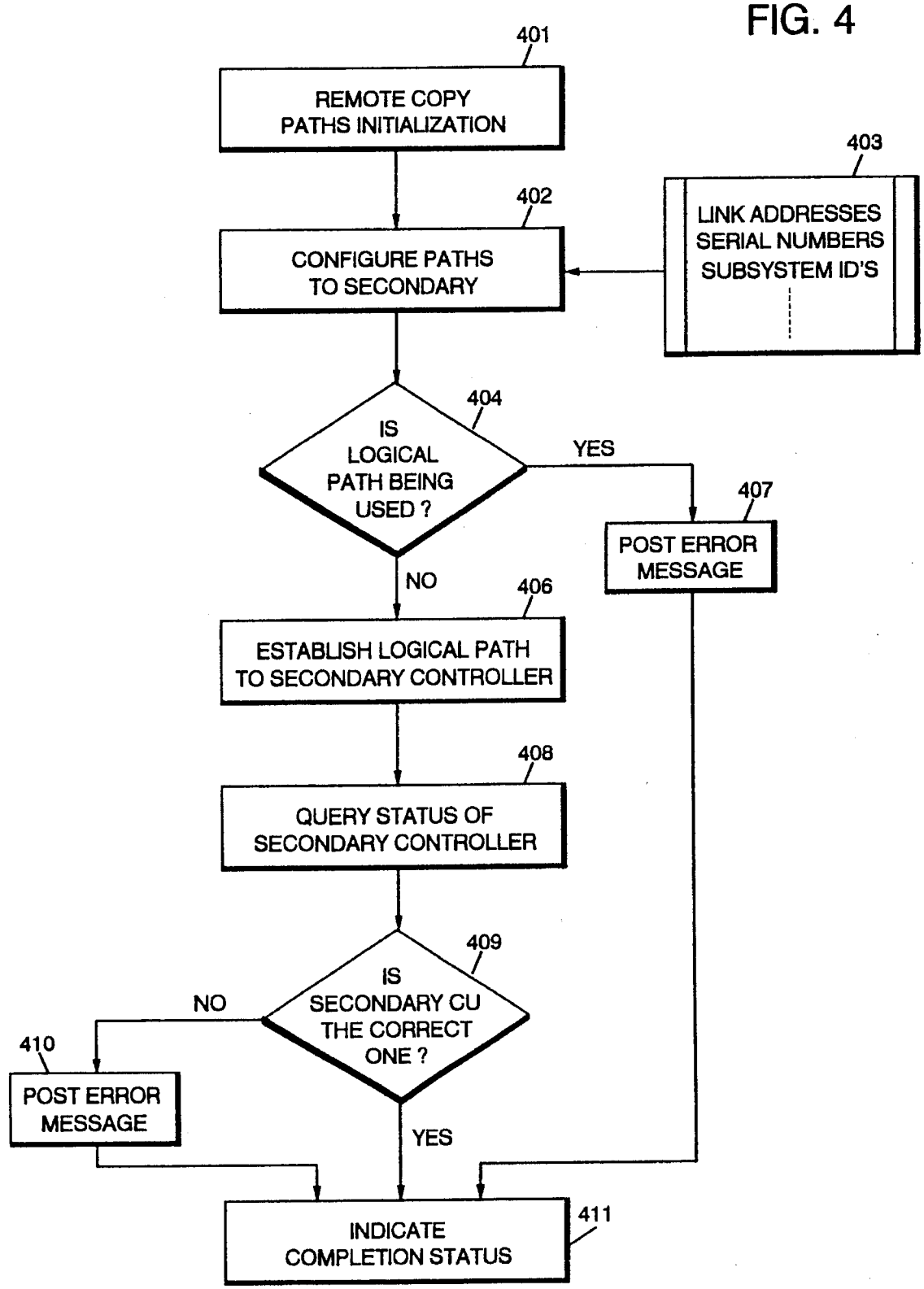
FIG. 4 is a flow diagram describing steps for initiating a remote copy path according to a preferred embodiment of the present invention.

FIG. 4 is a flow diagram describing a method for initiating a remote copy session between a primary site 360 and secondary site 370 (see FIG. 3) according to a preferred embodiment of the present invention. The remote copy session begins at step 401 wherein the primary host 301 issues a perform subsystem function (PSF) order establishing a remote or secondary storage controller for the remote copy session. Step 401 involves the primary processor 301 defining paths to be used between the primary and secondary sites 360 and 370, respectively, and further includes primary storage controller 325 initializing the defined paths.

Step 402 involves the primary storage controller 325 configuring the paths for allowing the primary storage controller 325 to communicate with a secondary storage controller, for example, secondary storage controller 335. At step 403 the expected secondary storage controller 335 characterizations are saved by the primary storage controller 325 including link addresses, serial numbers, subsystem identification (SSIDs), etc. Having identified the path connections, the primary storage controller 325 checks each logical path for use and redundancy (whether the same logical path is already defined as a logical path to another secondary storage controller) at step 404. If the defined logical path is already defined, step 407 posts, via the primary storage controller 325, an appropriate error message to an operator at the primary processor 301 for remedial actions.

If the logical path definition is allowed, step 406 establishes that logical path to the secondary storage controller 335 and communication over that logical path is enabled. At step 408 the primary storage controller 325 queries the secondary storage controller 335 regarding the characteristics as saved in step 403, and additionally information regarding the status of the secondary storage controller 335 including whether cache or non-volatile storage (NVS) is active, etc. Step 409 is a check to determine whether the secondary controller 335 characteristics correspond with the expected characteristics derived in step 403 for ensuring that the secondary storage controller 335 is in fact the desired secondary storage controller. A mismatch in characteristics will cause step 410 to post an error message, via the primary storage controller 325, to the primary host 301 operator. Otherwise, step 411 receives an okay from step 409, and step 411 indicates to the primary host 301 that the remote copy path initialization has completed successfully. During this initialization process, ports 334 (A–B) have functioned in control unit link-level facility mode.

Figure 5:
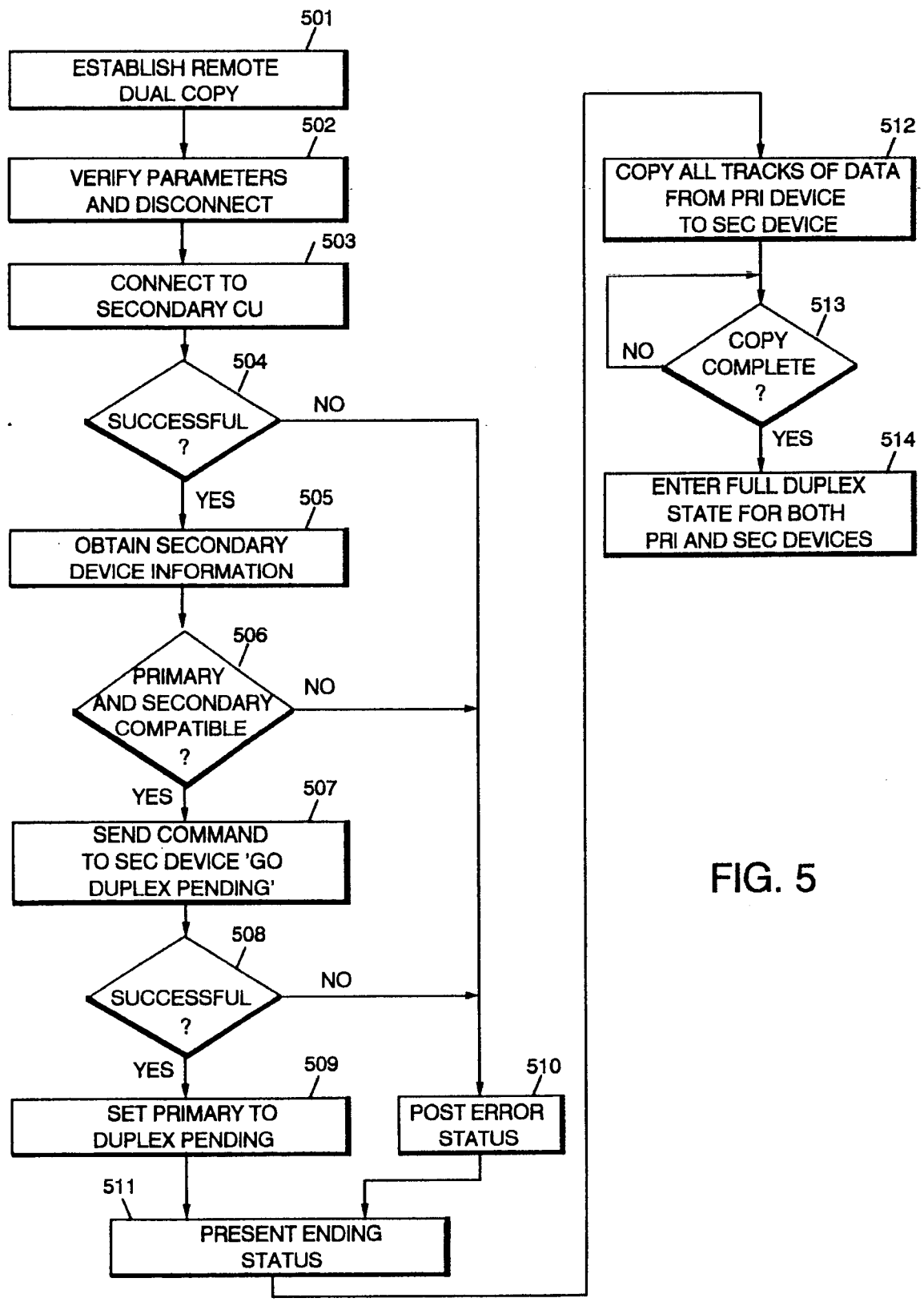
FIG. 5 is a flow diagram describing steps for establishing a remote device according to a preferred embodiment of the present invention.

Referring now to FIG. 5, primary and secondary devices, for example, within primary DASDs 326 and secondary DASDs 336, are established for remote copy. Step 501 specifies the actual devices for forming duplex pairs. Device parameters of the established devices are verified at step 502, including primary and secondary device addresses, device types, and serial numbers, etc. The primary storage controller 325 attempts to connect to the secondary storage controller at step 503 thus verifying that the specified secondary device exists. Step 504 determines whether the connection was successful, and if not, step 510 posts an appropriate error message to the primary host 301 operator.

If the connection was successful, step 505 causes the secondary device parameters to be retrieved to the primary storage controller 325.

A test is made at step 506 to determine whether the established primary and secondary devices making up a duplex pair are compatible, that is, can data written to the primary device be shadowed to the secondary device. Determining that incompatible devices are established causes an error message to be posted by step 510. A finding of device compatibility causes step 507 to execute an Update Secondary Status command, or more specifically, a "Go Duplex Pending" order is issued to the secondary device for initiating a pending duplex pair between the primary and secondary devices. Step 508 tests a result of the attempted "Go Duplex Pending" and causes step 510 to issue an appropriate error message in the case of a failure. If "Go Duplex Pending" succeeded at the secondary device, then step 509 sets the corresponding primary device to duplex pending and a proper status ending status is presented to the primary processor 301 at step 511.

Having established duplex pending between the primary and secondary devices, actual data shadowing is ready to begin. Step 512 involves the primary storage controller 325 sending data to be shadowed to the secondary storage controller 335. The data can be sent as records, tracks, or groups of tracks as is appropriate. The received data is stored, for example, in cache or non-volatile storage (NVS), in the case of DASD fast write, of the secondary storage controller 335. Step 513 signals the primary storage controller 325 when the secondary copy was successfully written to secondary storage controller 335 and secondary DASD 336. Successfully writing the received data to secondary DASD establishes full duplex for the primary and secondary device pair. Full duplex is indicated by step 514. The received data is thereafter actually written to the secondary device. Steps 501 through 514 are repeated for each primary/secondary pair to be established. Having established duplex pair(s), each participating secondary device or volume is fenced from normal data accesses yet allowed to receive some control commands for terminating, suspending a duplex pair, or obtaining status. At step 512, port 324 (A–B) is operating in channel link-level facility mode as will be described further.

Figure 6:
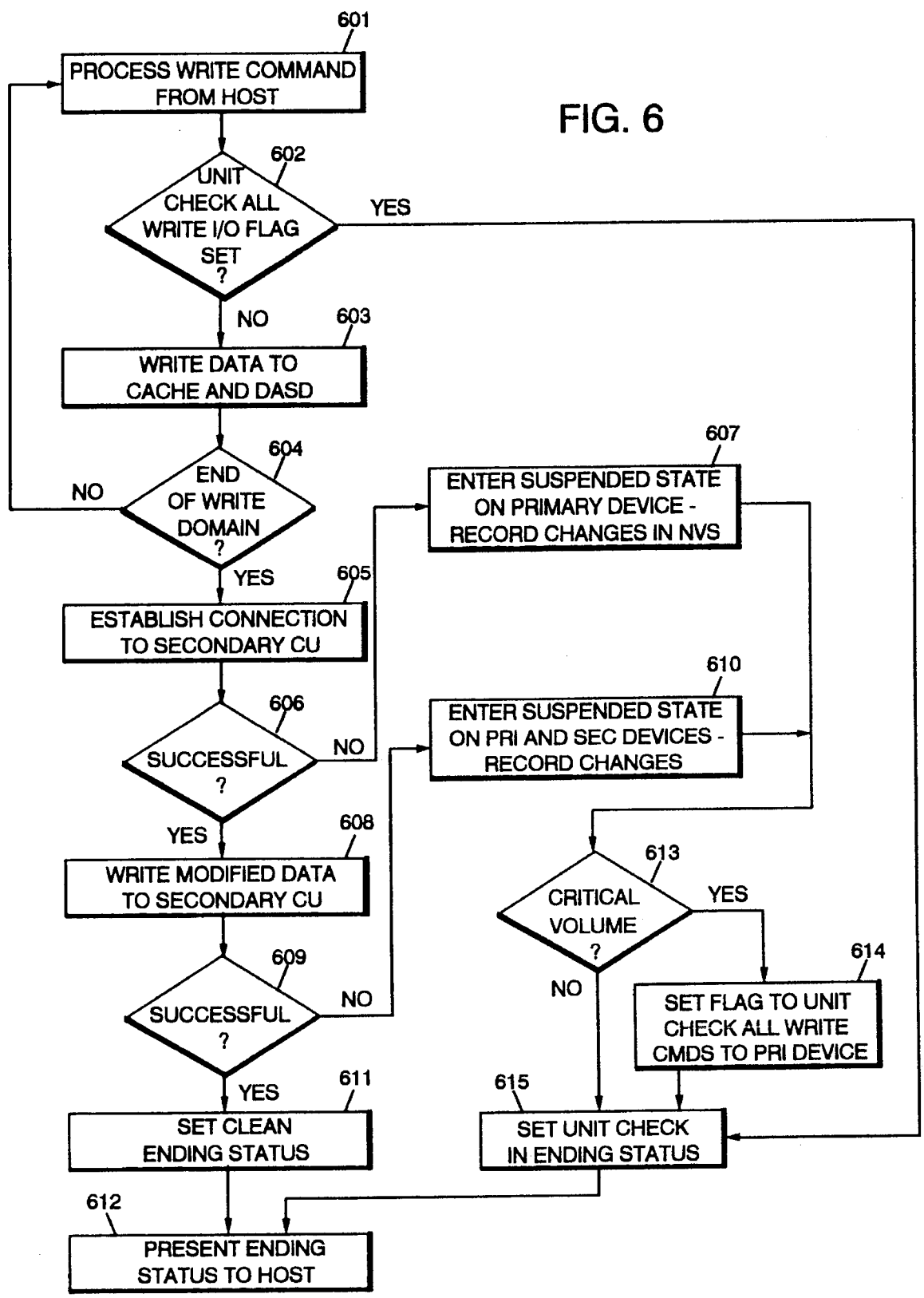
FIG. 6 is a flow diagram showing a write command intercept process at a primary site according to a preferred embodiment of the present invention.

FIG. 6 presents the steps of intercepting host write commands at the primary storage controller for the remote dual copy process. This is required since the primary storage controller 325 will interface acting as a host to the secondary storage controller 335. At step 601, while operating in duplex pair mode, the primary storage controller 325 intercepts primary host 301 write commands to the primary storage controller 325 duplex pair devices. Step 602 determines whether a Unit Check Write I/O flag is set for determining further whether it is appropriate to write critical data to the primary device. If the Unit Check Write I/O flag is not set, the data is written to primary cache or NVS and thereafter to the primary device. Data is written to the primary cache or NVS (and eventually to the primary device) until step 604 indicates that an End of Write Domain is reached, steps 601 through 603 being repeated until then. That write data which has been modified is marked in primary cache and the respective location marked in NVS to indicate that the modified data needs to be transmitted to the secondary storage controller 335.

Having processed the primary host 301 write commands and stored the data at the primary storage controller 325, step 605 establishes a connection to the selected secondary storage controller 335 and corresponding device according to a previously established path. If the secondary storage controller 335 connection is established successfully, step 606 allows remote copy to proceed wherein the marked or modified data is transmitted to the secondary storage controller 335 at step 608, the transmitted data being stored at the secondary storage controller 335. Step 609 determines whether the marked or modified data was successfully written to the secondary storage controller 335. A successful write to the secondary storage controller 335 results in a CE/DE being sent to the primary storage controller 325 by step 611 and ending status being sent from the primary storage controller 325 to the primary host 301 at step 612.

Referring back to step 606, if the connection to the secondary storage controller 335 was not successful, then at step 607 the primary storage controller 325 enters a suspended state and addresses of modified data is stored in table in NVS. Similarly, if the marked or modified data was not successfully written to the secondary storage controller 335, from step 609, step 610 causes suspended state to be entered on the primary and secondary storage controllers 325 and 335 and the addresses of marked or modified data is stored to NVS on the primary storage controller 325. From Step 607 or 610, step 613 determines whether the volume at the secondary storage controller 335 to which marked data was to be copied is a critical volume. If step 613 determines the secondary volume is not critical, step 615 sets a Unit Check in Ending Status (see step 602) and step 612 is performed. On the other hand, if step 613 determines that the volume is a critical volume, then step 614 sets the "Unit Check Flag" which will affect all Write commands to that paired primary device. Having set the "Unit Check Flag", when step 602 is next encountered, Write I/Os will not be allowed to the primary device 326.

Modifying the link-level facilities to have an ability to dynamically (electronically versus manually) assume either the role of channel link-level facility or control unit link-level facility provides flexibility and reduces a number of required communication links as described herein. In the past, no mechanism existed within the ESCON architecture to allow a logical path to be established between storage controllers. Furthermore, ESCON protocol did not allow a storage controller to transfer certain frames. When link-level facilities are allowed to assume the dual roles it becomes necessary to determine, within the ESCON facility, which role each link-level facility is assuming.

The role that a link-level facility assumes is determined on a logical path basis. Establishing logical paths between storage controllers is accomplished with a combination of an Establish Logical Path (ELP) link-level frame and a device level control frame for indicating that the logical path supports peer-to-peer protocols. The device level control frame is an Establish Pathing Control (EPC) frame and is sent from one storage controller to another storage controller on a previously established logical path. When a storage controller receives an EPC frame it tags the previously established logical path for peer-to-peer protocol exclusively. A primary storage controller is thereby allowed to perform any functions on a peer-to-peer logical path that a channel is allowed to perform according to the ESCON architecture.

Figure 7:
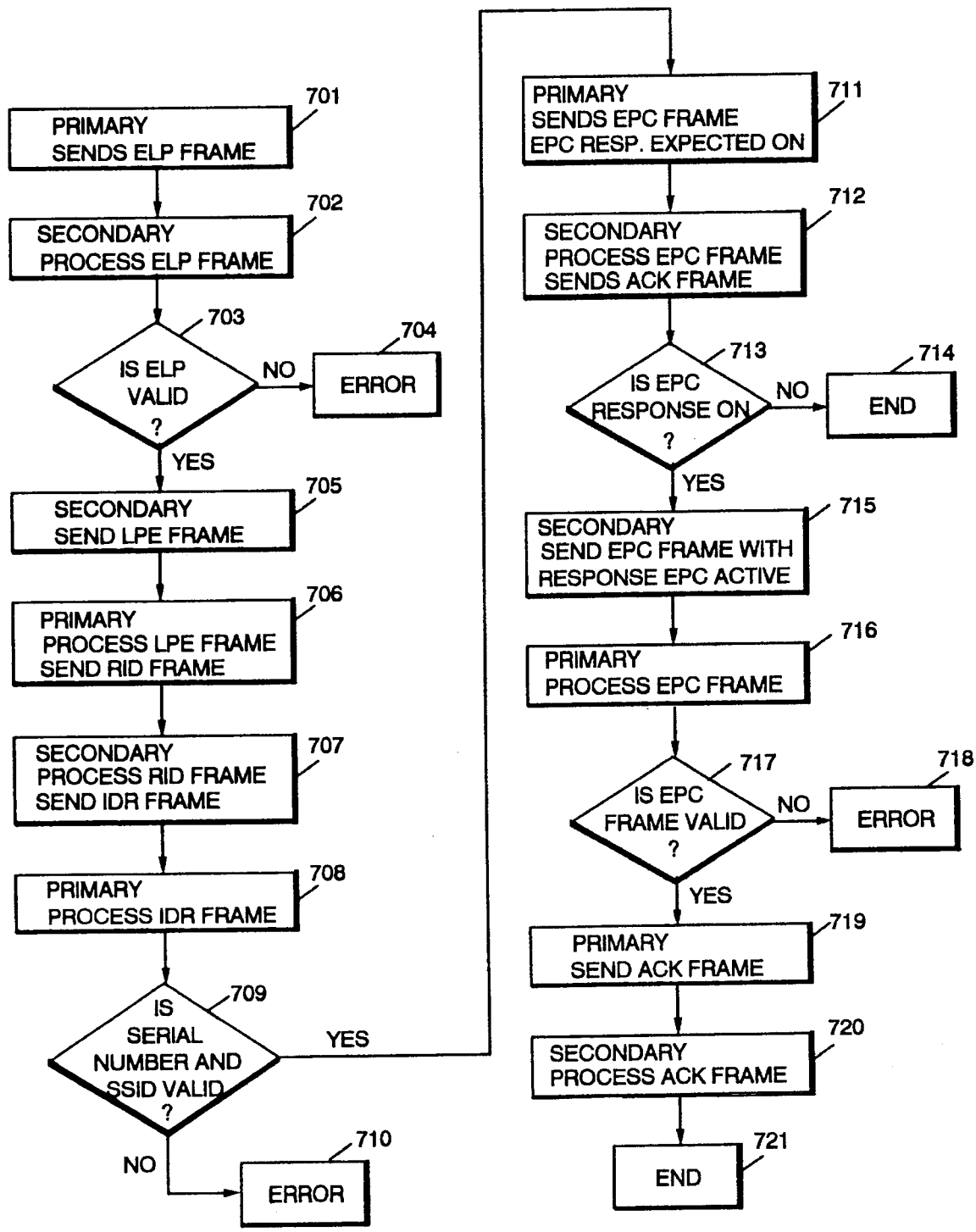
FIG. 7 is a flow diagram depicting an Establish Pathing Control sequence according to a preferred embodiment of the present invention.

FIG. 7 diagrams a process for defining a logical peer-to-peer path. Steps 701 through 721 reflect the steps 406 through 410 depicted in FIG. 4 but in greater detail. At step 701, the primary storage controller 325 sends an ELP frame to the secondary storage controller 335. The secondary storage controller processes the ELP frame at step 702. Step 703 determines whether the ELP frame is valid and if not, causes an error message to be posted to the primary host 301, via the primary storage controller 325, at step 704. If the ELP frame is valid, at step 705 the secondary storage controller 335 returns a logical path established (LPE) frame to the primary storage controller 325 signifying whether the status is okay. If a problem exists, for example, parameters don't match or no logical path space is available, a logical path reject (LPR) or link reject (LRJ) will be returned. The primary storage controller 325 processes the LPE frame at step 706 and requests identification (RID) from the secondary storage controller 335. The secondary storage controller processes the RID frame at step 707 and returns an identifier response (IDR) frame including a serial number, SSID, etc. The primary storage controller 325 processes the IDR frame at step 708 and at step 709 determines whether the returned serial number and SSID are correct. If an error is found, step 710 posts an error message for the primary host 301 operator.

The primary storage controller 325, acting as host with the ports 324 enabled as channel link-level facility, sends an EPC frame to the secondary storage controller 335 at step 711. An example of an EPC frame is as follows:

| BIT | DEFINITION |
| --- | --- |
| 0 | EPC response expected, secondary must send an EPC frame to the primary with "response EPC" flag set; |
| 1 | Response EPC, indicates the secondary received the EPC frame from the primary and is responding with an EPC frame; |
| 2 | Primary uses a modified read command protocol; |
| 3 | Primary uses Request Connect (RQC) frames to initiate I/O. |

At step 712 the secondary storage controller 335 processes the EPC frame and returns an acknowledgement (ACK) frame. At step 713 the secondary storage controller 335 determines whether the "EPC Response Expected" was set. If the "EPC Response Expected" was not set, then the process for establishing the path is completed at step 714 (architecture specific). If the "EPC Response Expected" was set, then at step 715 the secondary storage controller 335 replies with its own EPC frame with the EPC response bit set. At step 716 the primary storage controller processes the EPC frame and at step 717 the EPC frame is tested for validity. An error in the EPC frame causes step 718, via the primary storage controller 325, to post a corresponding error message to the primary processor 301. A valid EPC frame response from the secondary storage controller 335 results in the primary storage controller 325 responding back at step 719 with an ACK frame. The secondary storage controller 335 processes the received ACK frame at step 720 and the process is completed at step 721.

Figure 8:
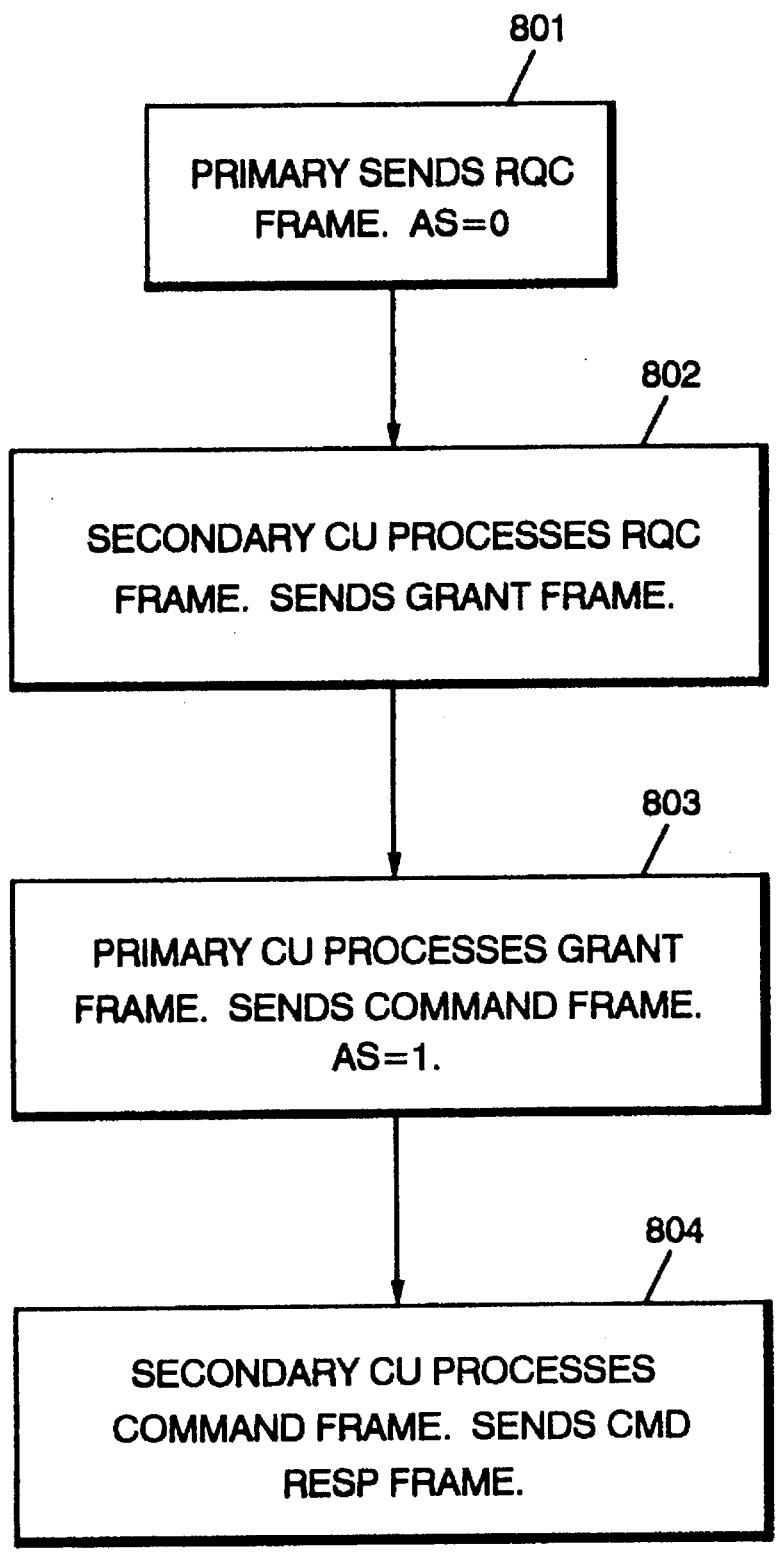
FIG. 8 is a flow diagram depicting steps for an expanded Request Connect according to a preferred embodiment of the present invention.

Referring to FIG. 8, steps 801 through 804 present in greater detail the process described at step 605 (FIG. 6). When initiating an I/O operation, a command frame is normally sent to the secondary storage controller 335. A performance improvement is obtained by using serial adapter (SA) request connect hardware to perform a request connect frame (RQC) for initiating the I/O operation. At step 801 a primary storage controller 325 SA sends an RQC frame with address specific (AS) set to zero (the secondary device address not yet specified). If the secondary storage controller 335 responds with a link busy (LBY) or port busy (PBY) the primary storage controller 325 SA automatically re-sends the RQC frame with AS set to zero. Thus RQC is not using microcode resources while polling the secondary storage controller 335.

The secondary storage controller 335 processes the RQC frame at step 802 and if the connection is clear, returns a Grant frame. The primary storage controller 325 processes the Grant frame at step 803 at which point a Command frame with AS set to one (including an address of the secondary device to be connected). The command frame is processed at the secondary storage controller 335 at step 804 and a command response (CMR) frame is returned.

Read command protocols are modified with the introduction of dynamically definable link-level facilities. The following conditions are required to be met under standard ESCON architectures:

(1) A channel command word (CCW) byte count of zero requires a device header flag byte to have an end bit set to one and a data request bit set to zero; and (2) A CCW count not set to zero requires the device header flag bit to have the data request bit set to one, and the CCW count bytes set to a size of a first (or only) data request, The end bit is either one or zero depending upon whether this is an only data request.

FIG. 9 shows how on a peer-to-peer logical path the command frame is allowed to have the end bit, data request bit and CCW count all set to zero (as established by the EPC frame). A new protocol for a first command in a chain is shown by steps 901 through 904. At step 901 the primary storage controller 325 sends a command frame having an end bit, data request bit and CCW count all set to zero. At step 902 the secondary storage controller 335 receives the command frame and returns a CMR frame. The primary storage controller 325, at step 903, processes the CMR frame, returns an "accept CMR" response frame, followed by a data request frame with end bit set to zero or one, data request bit set to one, and CCW count set to the number of bytes of the data request. Step 904 includes processing the accept CMR frame at the secondary storage controller 335 and processing the data request frame, and sending the requested data.

A chained read command protocol is described by steps 911 through 914. Step 911 is similar to step 901 and step 912 is similar to step 902. Step 913 includes processing the CMR at the primary processor 325 and sending a data request frame with end bit set to zero or one, data request bit set to one, and CCW count set to the number of bytes of the first data request. The secondary storage controller 335 processes the data request frame and sends the data frames at step 914.

In summary, a remote dual copy system having reconfigurable link-level facilities is described. The remote dual copy system includes a primary host having at least one channel, and a primary storage subsystem having at least one link-level facility. The remote dual copy system further includes a secondary host having at least one channel, and a secondary storage subsystem having at least one link-level facility. A dynamic switch couples the primary and secondary hosts and the primary and secondary storage subsystems via at least one communication link, for example, and ESCON link, according to corresponding channels and link-level facilities. The primary host initiates a remote copy session communicating with the primary storage subsystem and initializes paths thereto, the at least one link-level facility of the primary and secondary storage subsystems operating in a control unit link-level facility mode. The at least one primary storage subsystem link-level facility is dynamically re-configured for operating in a channel link-level facility mode, the primary storage subsystem acting as a host to the secondary storage subsystem and establishing logical paths and pathing control therebetween. The primary storage controller intercepting primary host write commands for sending modified data to the secondary storage subsystem.

While the invention has been particularly shown and described with reference to preferred embodiments thereof, it will be understood by those skilled in the art that various changes in form and details may be made therein without departing from the spirit and scope of the invention. For example, the communication links between primary and secondary processors and between primary and secondary storage controllers may vary. Although examples have been set forth herein regarding communication between a primary and a secondary storage subsystem, the primary storage subsystem can communicate with multiple secondary storage subsystems. For example, a volume A and a volume B of primary DASD 323 can pair with a volume A' and a volume B', respectively on secondary DASD 333. Additionally, the secondary devices 333, 336 could be tape, optics, etc. Changes in future embodiments of the invention without departing from the teachings herein.

What is claimed is:

1. A method of communicating between a host processor, a first storage subsystem, and a second storage subsystem, the host processor, and first and second storage subsystems coupled together by at least one communication link, the host processor and each first and second storage subsystems each having at least one link-level facility, the method comprising machine effected steps of:

(a) initializing paths between the host processor and the first and second storage subsystems, wherein the host processor link-level facility is configured as a channel, and the first and second storage subsystem link-level facilities are each configured as a control unit link-level facility;

(b) configuring paths between the host processor and the first and second storage subsystems;

(c) establishing logical paths between the first and second storage subsystems, wherein the first storage subsystem link-level facility is dynamically re-configured as a channel link-level facility, the first storage subsystem acting as a host to the second storage subsystem; and (d) establishing pathing control between the first and second storage subsystems, wherein the first storage subsystem transmits an establish pathing control (EPC) frame to the second storage subsystem for processing.

2. The method according to claim 1 wherein the steps (a) through (d) are executed according to Enterprise Systems Connection (ESCON) protocol.

3. The method according to claim 1 further comprising a step (e) initiating a remote dual copy session by the host processor for shadowing data written on the first storage subsystem to the second storage subsystem.

4. The method according to claim 3 further comprising a step (f) marking modified data at the first storage subsystem and shadowing the marked data to the second storage subsystem.

5. The method according to claim 3 wherein the step (e) includes the first storage subsystem intercepting write commands from the host processor.

6. The method according to claim 5 wherein the step (d) includes the second storage subsystem testing the EPC frame for determining whether an EPC response bit is set.

7. The method according to claim 6 wherein the step (d) further includes the second storage subsystem processing the EPC frame from the first storage subsystem and responding with an EPC frame indicating EPC is active.

8. The method according to claim 7 wherein the step (d) further includes the first storage subsystem determining whether the EPC frame received from the second storage subsystem is valid.

9. The method according to claim 8 wherein the step (f) includes the first storage subsystem requesting connection to the second storage subsystem by sending a request connect (RQC) command with address specific (AS) set to zero, the first storage subsystem sending AS set to one with an actual address after receiving a grant frame from the second storage subsystem.

10. The method according to claim 9 further comprising a step (g) sending a read command frame to the second storage subsystem from the first storage subsystem wherein an end bit, data bit and channel command word (CCW) count are all initially set to zero, and wherein the second storage subsystem responds with a command response frame.

11. A storage controller for communicating with a host processor and receiving data therefrom and communicating with another storage controller over at least one enterprise system connection (ESCON) link, the host processor having a channel link-level facility port, the storage controller comprising:

a serial adapter for connecting to the ESCON link;

a storage path for providing a data path for data received in the storage controller for storage; and at least one link level facility dynamically reconfigurable as a control unit link-level facility for communicating with the host processor over the ESCON link, and further dynamically re-configurable as a channel link-level facility for communicating with the another storage controller over the ESCON link, wherein the storage controller acts as host to the another storage controller.

12. The storage controller according to claim 11 further comprising a storage device coupled to the storage path.

13. The storage controller according to claim 12 wherein the storage device is a direct access storage device (DASD).

14. The storage controller according to claim 13 further comprising a dynamic switch coupled between the storage controller and the another storage controller.

15. The storage controller according to claim 14 wherein the serial adapter sends to the another storage controller a request connect (RQC) command with address specific (AS) set to zero, the serial adapter sending AS set to one with an actual address after receiving a grant frame from the another storage controller.

16. The storage controller according to claim 15 wherein the storage controller sends a read command frame to the another storage controller wherein an end bit, data bit and channel command word (CCW) count are all initially set to zero, and wherein the another storage controller responds with a command response frame.

17. A remote dual copy system, comprising:

a primary host having at least one channel;

a primary storage subsystem having at least one link-level facility;

a secondary host having at least one channel;

a secondary storage subsystem having at least one link-level facility;

at least one communication link; and a dynamic switch coupling the primary and secondary hosts and the primary and secondary storage subsystems via the at least one communication link and corresponding channels and link-level facilities, wherein the primary host initiates a remote copy session communicating with the primary and secondary storage subsystems and initializes paths thereto, the at least one link-level facility of the primary and secondary storage subsystems operating in a control unit link-level facility mode, and further wherein the at least one primary storage subsystem link-level facility is dynamically re-configured for operating in a channel link-level facility mode, the primary storage subsystem acting as a host to the secondary storage subsystem and establishing logical paths and pathing control therebetween, the primary storage controller intercepting primary host write commands for sending modified data to the secondary storage subsystem.

* * * * *